United States Patent
Biswas et al.

(10) Patent No.: US 10,862,461 B1
(45) Date of Patent: Dec. 8, 2020

(54) TECHNIQUES FOR GENERATING SWITCH CONTROL SIGNALS

(71) Applicant: QUALCOMM Incorporated, San Diego, CA (US)

(72) Inventors: Tonmoy Biswas, Bangalore (IN); Sreenivasa Mallia, Bangalore (IN); Krishnaswamy Thiagarajan, Bangalore (IN); Ashok Swaminathan, Cardiff, CA (US); Vinod Panikkath, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/431,943

(22) Filed: Jun. 5, 2019

(51) Int. Cl.
*G06F 1/04* (2006.01)
*H03K 3/00* (2006.01)
*H03K 3/037* (2006.01)
*H03K 5/13* (2014.01)
*H04B 1/40* (2015.01)
*H03K 5/00* (2006.01)
*H03K 19/20* (2006.01)

(52) U.S. Cl.
CPC .............. *H03K 3/037* (2013.01); *H03K 5/13* (2013.01); *H03K 19/20* (2013.01); *H03K 2005/00019* (2013.01); *H04B 1/40* (2013.01)

(58) Field of Classification Search
CPC .... G06F 1/10; G06F 1/04; G06F 1/08; H03K 5/135; G11C 7/22
USPC .......................................................... 327/291
See application file for complete search history.

(56) References Cited

U.S. PATENT DOCUMENTS

| | | | | |
|---|---|---|---|---|
| 3,828,312 A | * | 8/1974 | Long ................... | G06F 11/3013 340/12.14 |
| 2005/0057480 A1 | * | 3/2005 | Liao ..................... | G09G 3/3677 345/98 |
| 2007/0047688 A1 | * | 3/2007 | Sung .................... | H03D 13/001 375/375 |
| 2014/0064404 A1 | * | 3/2014 | Gonzalez ............ | H04L 25/0288 375/296 |

FOREIGN PATENT DOCUMENTS

JP  01234075 A  *  9/1989

* cited by examiner

*Primary Examiner* — Anh Q Tra
(74) *Attorney, Agent, or Firm* — Patterson + Sheridan, L.L.P. Qualcomm (57) ABSTRACT

Certain aspects of the present disclosure are directed to a circuit for switch control. The circuit generally includes a plurality of flip-flops, each of the plurality of flip-flops having an input coupled to a respective one of a plurality of enable signals, a NOR gate having inputs coupled to outputs of the plurality of flip-flops; a plurality of AND gates, each having an input coupled to a respective one of the plurality of enable signals and having another input coupled to an output of the NOR gate, and a delay element coupled between the output of the NOR gate and reset inputs of the plurality of flip-flops.

18 Claims, 8 Drawing Sheets

TECHNIQUES FOR GENERATING SWITCH CONTROL SIGNALS

TECHNICAL FIELD

Certain aspects of the present disclosure generally relate to electronic circuits and, more particularly, to switch control circuitry.

BACKGROUND

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. The base station and/or mobile station may include radio frequency (RF) front-end circuitry. The RF front-end circuitry may include switches for selectively coupling various nodes to a common connection terminal.

SUMMARY

Certain aspects of the present disclosure are directed to a circuit for switch control. The circuit generally includes a plurality of flip-flops, each of the plurality of flip-flops having an input coupled to a respective one of a plurality of enable signals, a NOR gate having inputs coupled to outputs of the plurality of flip-flops; a plurality of AND gates, each having an input coupled to a respective one of the plurality of enable signals and having another input coupled to an output of the NOR gate; and a delay element coupled between the output of the NOR gate and reset inputs of the plurality of flip-flops.

Certain aspects of the present disclosure are directed to a method for switch control. The method generally includes receiving a plurality of enable signals for controlling a plurality of switches, disabling a control mechanism for controlling the plurality of switches for a time period from when an enable signal of the plurality of enable signals transitions from a first logic state to a second logic state, and enabling the control mechanism after the time period.

Certain aspects of the present disclosure are directed to an apparatus for switch control. The apparatus generally includes means for controlling a plurality of switches, means for receiving a plurality of enable signals for controlling the plurality of switches, means for disabling a switch control function of the means for controlling for a time period from when an enable signal of the plurality of enable signals transitions from a first logic state to a second logic state, and means for enabling the control mechanism after the time period.

Certain aspects of the present disclosure are directed to an apparatus for switch control. The apparatus generally includes switch control circuitry configured to control a plurality of switches, and logic configured to receive a plurality of enable signals for controlling the plurality of switches, disable a switch control function of the switch control circuitry for a time period from when an enable signal of the plurality of enable signals transitions from a first logic state to a second logic state, and enable the switch control function after the time period.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Certain aspects of the present disclosure are generally directed to switch control circuitry. For example, the switch control circuitry provided herein may generate signals that are non-overlapping (e.g., signals that are not logic high at the same time) for controlling switches.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" (or "coupled to") in the various tenses of the verb "connect" (or "couple") may mean that element A is directly connected (or coupled) to element B or that other elements may be connected between elements A and B (i.e., that element A is indirectly connected with element B). In the case of electrical components, the term "connected with" (or "coupled to") may also be used herein to mean that a wire, trace, or other electrically conductive material is used to electrically connect (coupled) elements A and B (and any components electrically connected (coupled) therebetween).

An Example Wireless System

Figure 1:
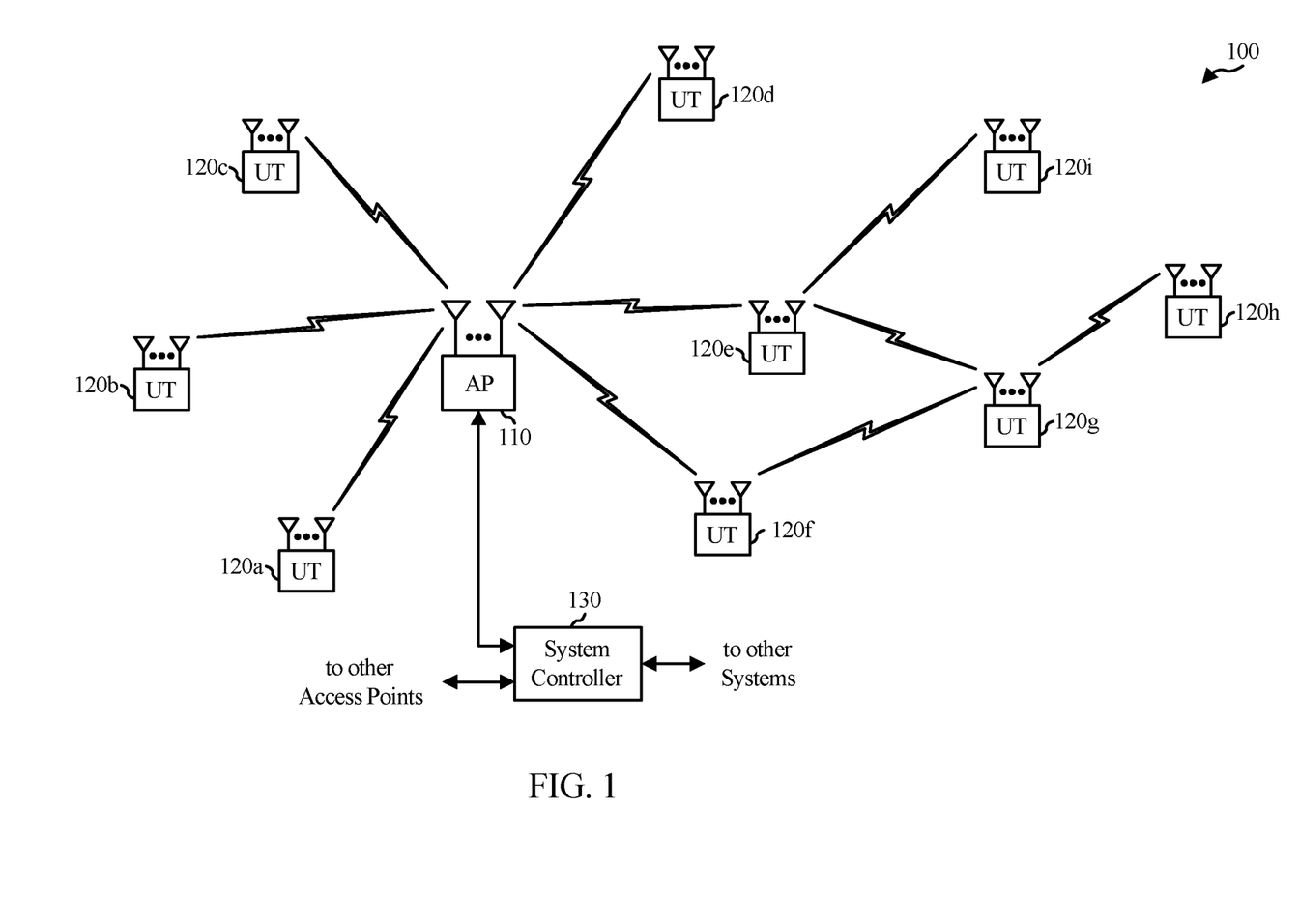
FIG. 1 is a diagram of an example wireless communications network, in accordance with certain aspects of the present disclosure.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

Wireless communications system 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The selected user terminals can have the same or different number of antennas.

Wireless communications system 100 may be a time division duplex (TDD) system or a frequency division duplex (FDD) system. For a TDD system, the downlink and uplink share the same frequency band. For an FDD system, the downlink and uplink use different frequency bands. Wireless communications system 100 may also utilize a single carrier or multiple carriers for transmission. Each user terminal 120 may be equipped with a single antenna (e.g., to keep costs down) or multiple antennas (e.g., where the additional cost can be supported). In certain aspects of the present disclosure, the access point 110 and/or user terminal 120 may include a circuit switch control, as described in more detail herein.

Figure 2:
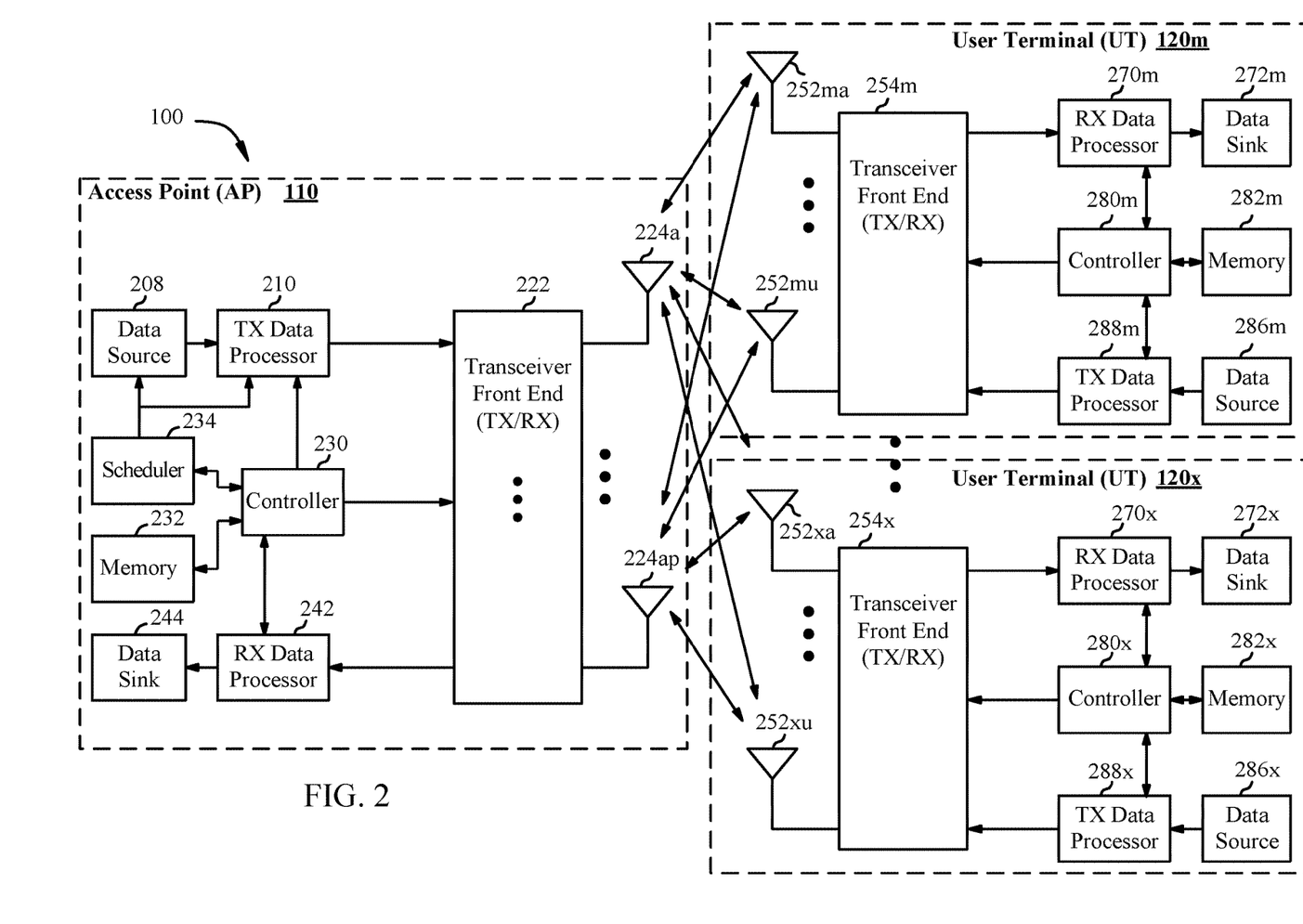
FIG. 2 is a block diagram of an example access point (AP) and example user terminals, in accordance with certain aspects of the present disclosure.

FIG. 2 shows a block diagram of access point 110 and two user terminals $120m$ and $120x$ in the wireless communications system 100. Access point 110 is equipped with $N_{ap}$ antennas $224a$ through $224ap$. User terminal $120m$ is equipped with $N_{ut,x}$ $N_{ut,m}$ antennas $252ma$ through $252mu$, and user terminal $120x$ is equipped with antennas $252xa$ through $252xu$. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas $224a$ through $224ap$ receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing. The transceiver front end (TX/RX) 222 of access point 110 and/or transceiver front end 254 of user terminal 120 may include may include a circuit switch control, as described in more detail herein.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Figure 3:
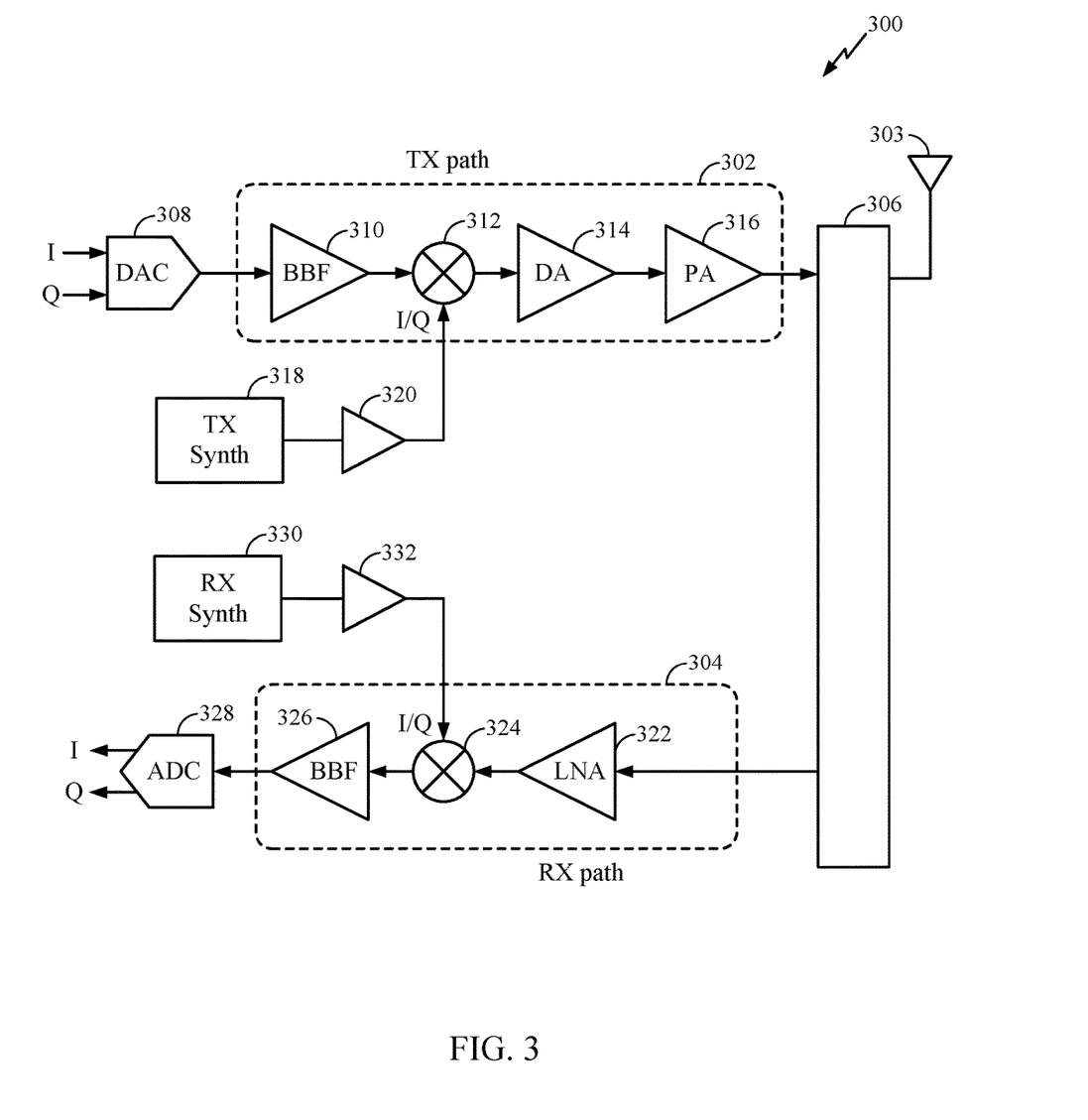
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a DAC 308, the TX path 302 may include a baseband filter (BBF) 310, a mixer 312, a driver amplifier (DA) 314, and a power amplifier (PA) 316. In certain aspects, the DA 314 may be selectively coupled to different supply voltage nodes via switches (not shown). In some cases, the transceiver front end 300 may include a circuit for controlling the switches, as described in more detail herein. The BBF 310, the mixer 312, and the DA 314 may be included in a radio frequency integrated circuit (RFIC), while the PA 316 may be external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning the LO to different frequencies typically entails using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324.

While FIGS. 1-3 provide a wireless communication system as an example application in which certain aspects of the present disclosure may be implemented to facilitate understanding, certain aspects described herein may be used for controlling of switches in any of various other suitable systems (e.g., any electronic system).

Example Techniques for Generating Switch Control Signals

To reduce the current consumption of circuitry such as a driver amplifier (DA) or baseband filter (BBF), different supply voltages may be used depending on various operating conditions. For example, a DA may be either coupled to a 1.8 V supply node or a 1.2 V supply node, depending on the transmit power or linearity specifications of the communication system.

Figure 4:
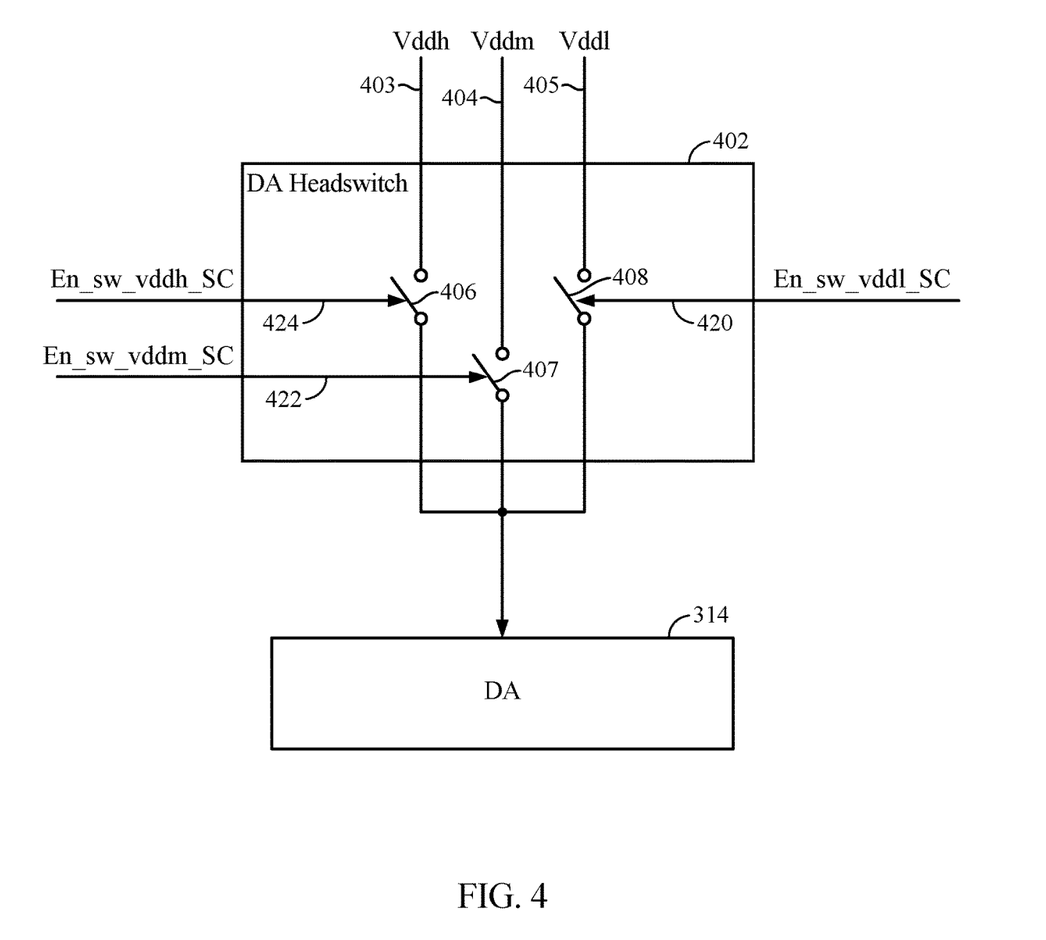
FIG. 4 illustrates drive amplifier (DA) head switch circuitry for selectively coupling supply nodes to the DA.

FIG. 4 illustrates DA head switch circuitry 402 for selectively coupling supply nodes 403, 404, 405 to the DA 314. As illustrated, the DA head switch circuitry 402 includes a switch 406, a switch 407, and a switch 408, each coupled between the DA 314 and a respective one of the supply nodes 403, 404, 405. For example, the supply node 403 may provide a relatively high supply voltage (Vddh), the supply node 405 may provide a relatively low supply voltage (Vddl), and the supply node 404 may provide a medium supply voltage (Vddm) that is between the supply voltages Vddh and Vddl. The switches 406, 407, 408 may be controlled via switch control signals 424, 422, 420 (labeled "En_sw_vddh_SC," "En_sw_vddm_SC," "En_sw_vddl_SC"), respectively.

The DA 314 may be supplied one of the supply voltages Vddh, Vddm, Vddl depending on an operating condition of the DA. For example, when linearity and/or transmit power specifications are relatively high, a higher supply voltage may be provided to the DA 314 by closing switch 406 and opening switches 407, 408, but when linearity and/or transmit power specifications are relatively low, a lower supply voltage may be provided to the DA 314 by closing switch 408 and opening switches 406, 407. In other words, the current consumption of the DA 314 may be reduced by operating the DA 314 with a lower supply voltage until linearity and/or transmit power specifications demand the use of a higher supply voltage.

If there is a time during which at least two of the switches 406, 407, 408 are concurrently closed, a large surge current may flow between at least two of the supply nodes. The large surge current not only reduces battery life, but adversely impacts the operations of other circuit elements. For example, if a large surge current flows from the supply node 403 to the supply node 405, and the supply node 405 is shared with a voltage-controlled oscillator (VCO) in a phase-locked loop (PLL), the surge current may cause the VCO frequency to change and the PLL to temporarily unlock.

Therefore, what is needed are non-overlapping signals (e.g., signals that are not logic high at the same time) for controlling switches (e.g., switches 406, 407, 408). Certain aspects of the present disclosure are directed to control circuitry for generating non-overlapping control signals. While FIG. 4 provides an example head switch for selectively coupling three supply nodes to a circuit (e.g., the DA 314) to facilitate understanding, any number of supply nodes may be selectively coupled to a circuit using the techniques described herein. Moreover, the non-overlapping signal generated using the techniques described herein may be used for controlling switches for any of various suitable applications. For example, the non-overlapping signals may be used to control switches of a duplexer which may be used for coupling an antenna terminal to either a receiver or a transmitter.

Figure 5:
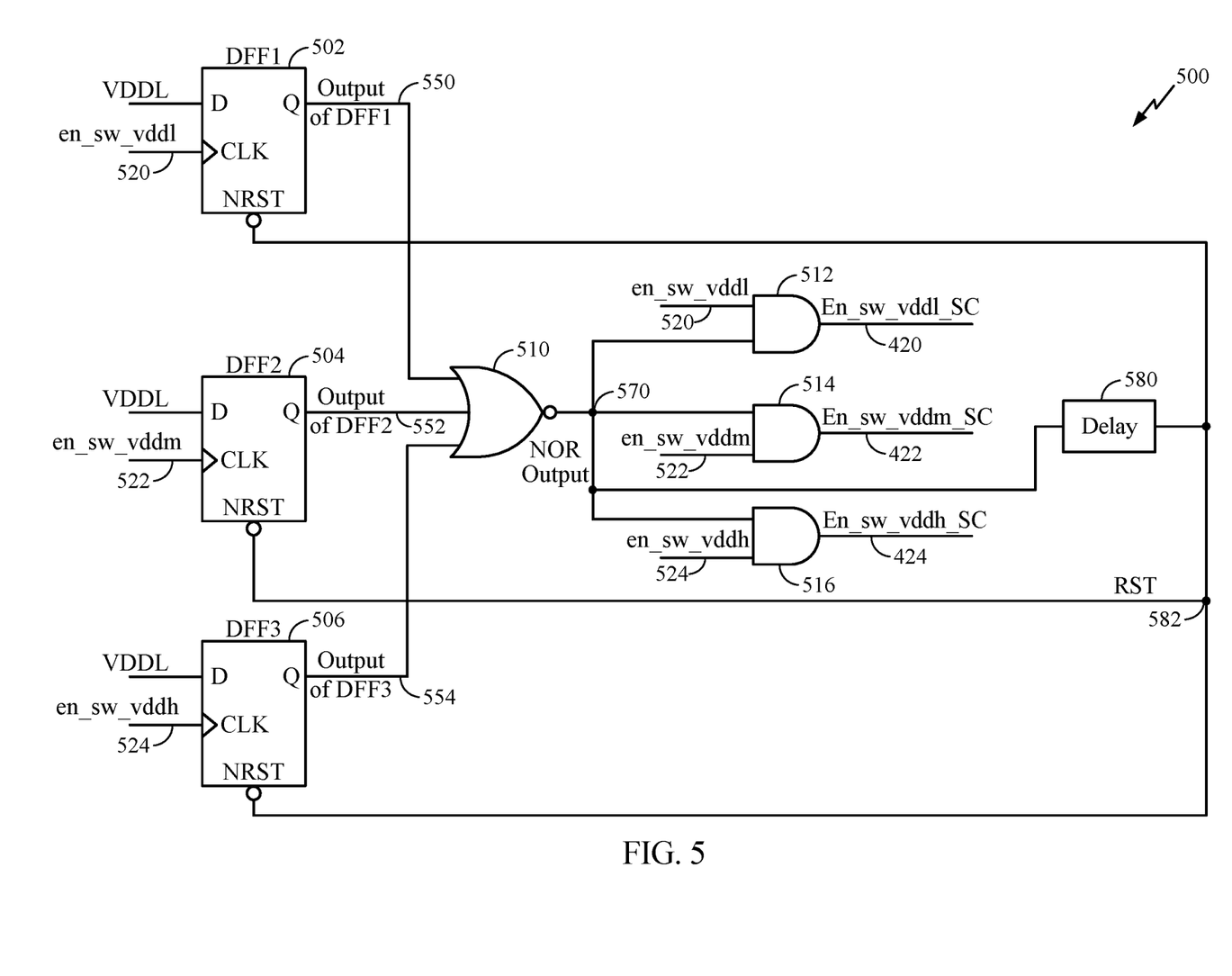
FIG. 5 is circuit diagram for generating non-overlapping signals, in accordance with certain aspects of the present disclosure.

FIG. 5 is a circuit diagram 500 for generating non-overlapping signals, in accordance with certain aspects of the present disclosure. In effect, the circuit diagram 500 disables the switch control function associated with the head switch (e.g., DA head switch circuitry 402) for a period of time each time the logic state of any of the enable signals for controlling the switches of the head switch is changed, as described in more detail herein.

In certain aspects, the circuit diagram 500 may include D-flip flops (DFFs) 502, 504, 506 (e.g., labeled as "DFF1," "DFF2," "DFF3"). The quantity of DFFs may be equal to the number of switches to be controlled. For example, while the circuit diagram 500 is implemented to generate three non-overlapping signals for controlling three switches to facilitate understanding, the techniques described herein may be used to generate two non-overlapping signals or more than three non-overlapping signals depending on the number of switches to be controlled. The operations of the circuit diagram 500 are described in more detail with respect to FIG. 6.

Figure 6:
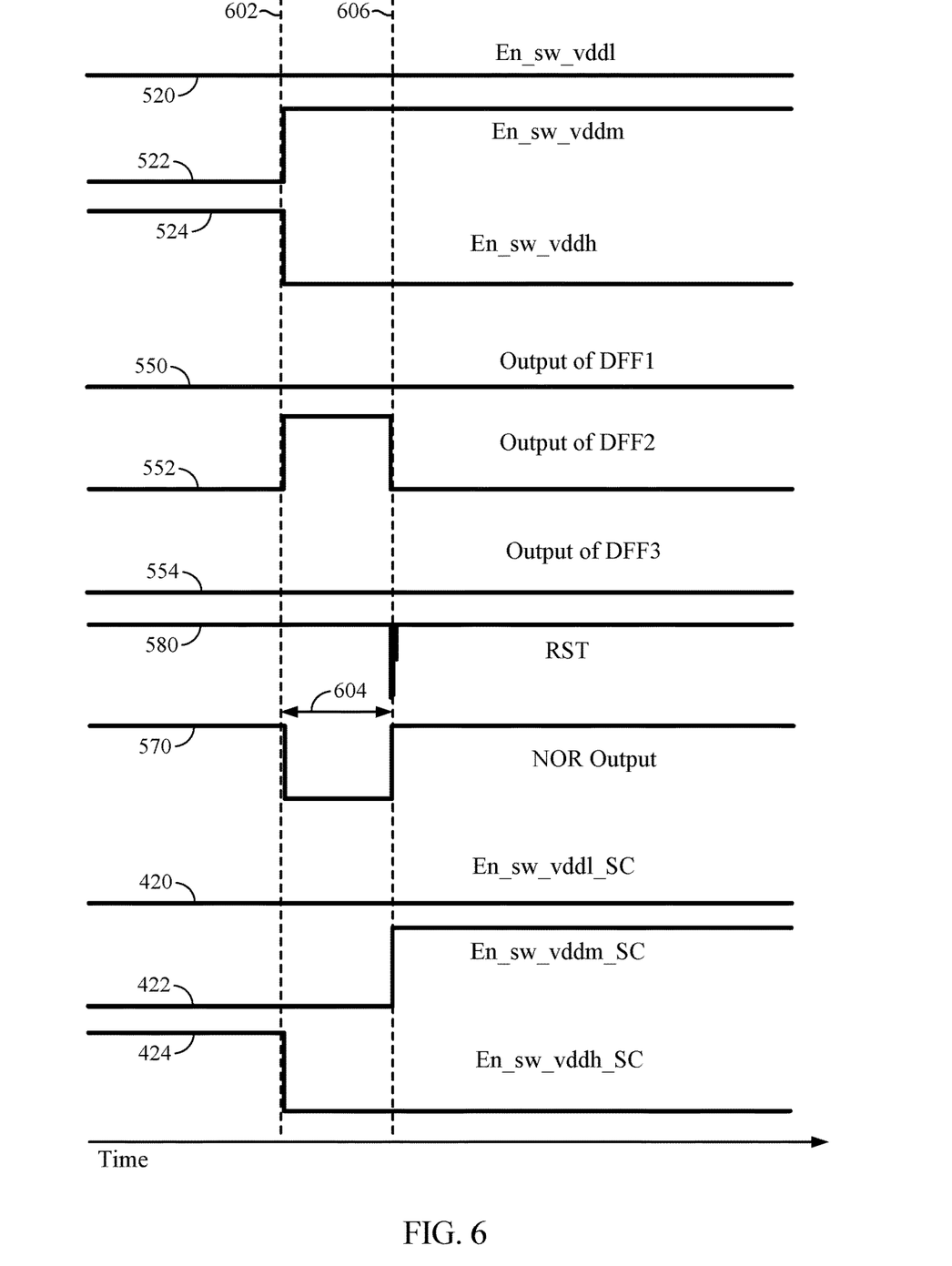
FIG. 6 is a graph illustrating various signals of the circuit diagram of FIG. 5, in accordance with certain aspects of the present disclosure.

FIG. 6 is a graph illustrating various signals of the circuit diagram 500, in accordance with certain aspects of the present disclosure. For example, three enable signals 520, 522, 524 (labeled "En_sw_vddl," "En_sw_vddm," and "En_sw_vddh") may be used to control the switches 406, 407, 408. The enable signals 520, 522, 524 may be provided to clock (CLK) inputs of the DFFs 502, 504, 506, as illustrated in FIG. 5. The input (labeled "D" in FIG. 5) of the DFFs 502, 504, 506 may be coupled to a voltage rail (e.g., labeled "VDDL" in FIG. 5), which may correspond to a logic high level. Thus, the output signal 550, 552, 554 of each of the DFFs 502, 504, 506 may transition from logic low to logic high when a respective one of the enable signals 520, 522, 524 transitions from logic low to logic high, thereby clocking in the VDDL signal.

The output signals 550, 552, 554 of the DFFs 502, 504, 506 are provided to inputs of a NOR gate 510. As illustrated in FIG. 6, when the enable signal 522 (En_sw_vddm) transitions from logic low to logic high at time 602, the output of the DFF 504 (DFF2) also transitions from logic low to logic high. If any of the output signals 550, 552, 554 of DFFs 502, 504, 506 is logic high, then the output signal of the NOR gate 510 is logic low. Thus, at time 602, the output signal 570 (labeled "NOR output") of the NOR gate 510 transitions from logic high to logic low.

As illustrated in FIG. 5, output signal 570 is provided to an input of each of AND gates 512, 514, 516. The enable signals 520, 522, 524 are provided to the other input of each of the AND gates 512, 514, 516, respectively. Thus, the output signals (e.g., switch control signals 420, 422, 424 used to control switches 406, 407, 408) of each of the AND gates 512, 514, 516 only represent a respective one of the enable signals 520, 522, 524 when the output signal 570 (NOR output) is logic high. Therefore, the output signal 570 transitioning from logic high to logic low effectively disables the control mechanism for controlling switches 406, 407, 408. As used herein, a control mechanism generally refers to circuitry configured to generate switch control signals (e.g., switch control signals 420, 422, 424) that represent respective enable signals (e.g., enable signals 520, 522, 524) intended to control the switches. For instance, the disabling of the control mechanism may involve disabling the switch control function of switch control circuitry, such as the AND gates 512, 514, 516, by setting an input to the AND gates to logic low. In other words, when the output signal 570 is logic low, all the switches remain in an open state regardless of the logic state of the enable signals 520, 522, 524.

As illustrated, the output signal 570 is also provided to a delay element 580. The delay element resets the DFFs 502, 504, 506 a specific time period 604 after the output signal 570 transitions to logic low at time 602. The specific time period 604 may be reconfigurable, as described in more detail herein.

After the time period 604, the delay element 580 provides a reset signal 582 (labeled "RST" in FIG. 6) to the reset inputs of the DFFs 502, 504, 506. The reset inputs of the DFFs 502, 504, 506 are negative logic reset inputs (e.g., labeled "NRST" in FIG. 5). In other words, the DFFs 502, 504, 506 are reset when the reset signal 582 is logic low. Thus, at time 606, the RST signal transitions from logic high to logic low, thereby resetting the DFFs 502, 504, 506, and shortly after, transitions from logic low back to logic high. Therefore, at time 606, the output signal 552 transitions from logic high back to logic low due to the DFF 504 being reset, resulting in the output signal 570 of the NOR gate 510 transitioning to logic high. With the output signal 570 (input signal of AND gates 512, 514, 516) being at logic high, the output signals of the AND gates 512, 514, 516 now represent the respective enable signals 520, 522, 524.

In other words, the circuit diagram 500 implements a break-before-make operation each time a head switch control signal is toggled. That is, each time one of the enable signals 520, 522, 524 transitions from logic low to logic high, the circuit diagram 500 effectively disables the control mechanism of the head switch for a time period (e.g. time period 604). The time period corresponds to a delay associated with the delay element 580, which may be set to be larger than an expected (or possible) overlap (e.g., overlap of logic high time periods) of the enable signals 520, 522, 524.

Figure 7:
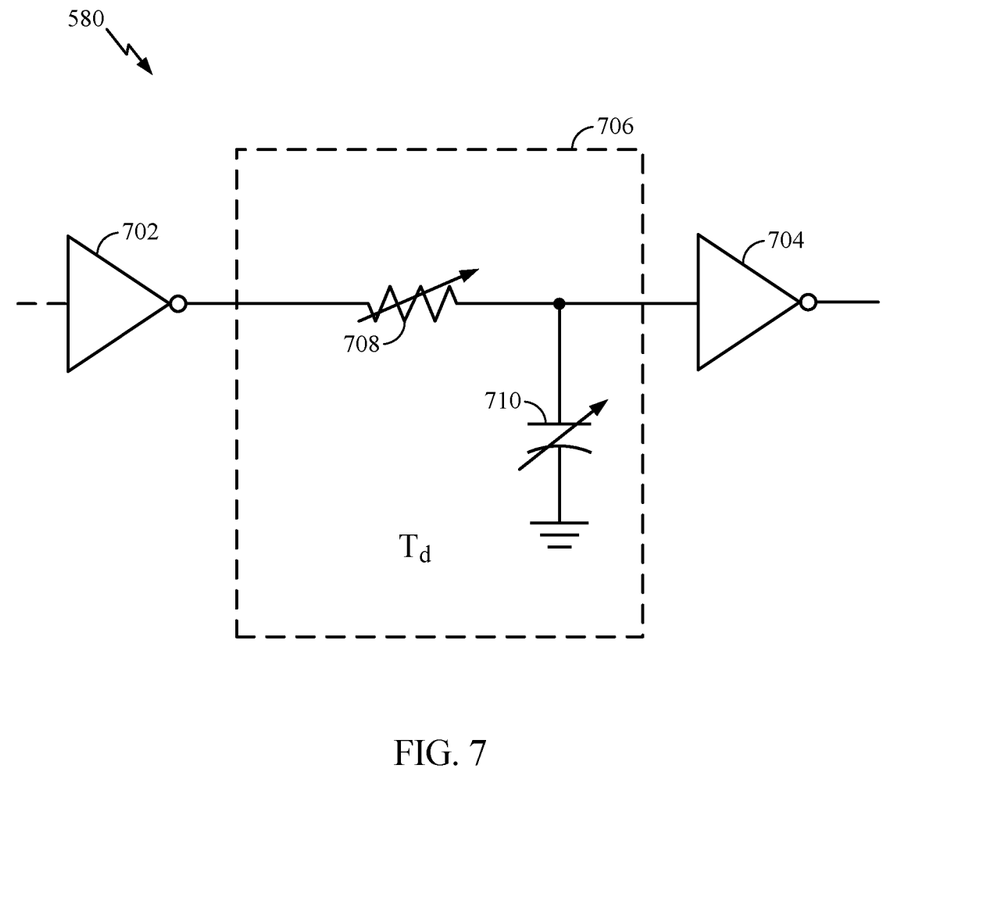
FIG. 7 is a circuit diagram of a delay element, in accordance with certain aspects of the present disclosure.

FIG. 7 is a circuit diagram of an example implementation of the delay element 580, in accordance with certain aspects of the present disclosure. For example, the delay element 580 may include inverters 702, 704 and a resistor-capacitor (RC) circuit 706 coupled between the inverters 702, 704. The RC circuit 706 may include a series resistive element 708 coupled to a shunt capacitive element 710, as illustrated. The RC time constant associated with the RC circuit 706 may be adjusted to set the delay associated with the delay element 580. For example, at least one of the resistance of the resistive element 708 or the capacitance of the capacitive element 710 may be adjusted to adjust the RC time constant for the RC circuit 706.

Figure 8:
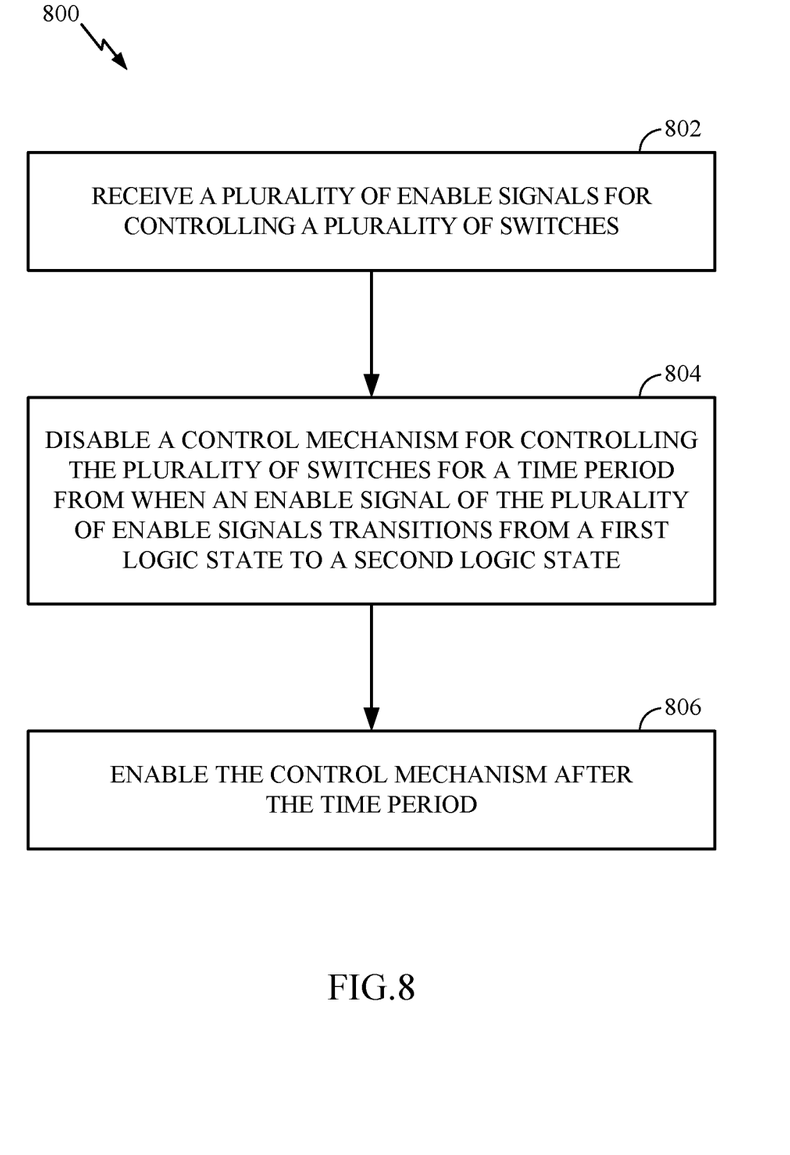
FIG. 8 is a flow diagram illustrating example operations for switch control, in accordance with certain aspects of the present disclosure.

FIG. 8 is a flow diagram illustrating example operations 800 for switch control, in accordance with certain aspects of the present disclosure. The operations 800 may be performed by a circuit, such as the circuit described with respect to FIGS. 5-7.

The operations 800 begin, at block 802, with the circuit receiving a plurality of enable signals for controlling a plurality of switches (e.g., switches 406, 407, 408). At block 804, the circuit may disable a control mechanism for controlling the plurality of switches for a time period (e.g., time period 604) from when (e.g. at time 602) an enable signal (e.g., enable signal 522) of the plurality of enable signals (e.g., enable signals 520, 522, 524) transitions from a first logic state (e.g., logic low) to a second logic state (e.g., logic high), and at block 806, enable the control mechanism after the time period.

In certain aspects, the control mechanism may include a plurality of AND gates (e.g., AND gates 512, 514, 516). In this case, the disabling of the control mechanism may involve providing (e.g., via the NOR gate 510) a signal having the first logic state to an input of the plurality of AND gates, and the enabling of the control mechanism may involve providing (e.g., via the NOR gate 510) a signal having the second logic state to the input of the plurality of AND gates.

In certain aspects, the plurality of enable signals are received at inputs of a plurality of flip-flops (e.g., DFFs 502, 504, 506). In this case, the operations 800 may include generating the signal having the first logic state and the signal having the second logic state by performing a NOR operation (e.g., via the NOR gate 510) of output signals generated by the plurality of flip-flops. In certain aspects, the operations 800 may include generating (e.g., via the NOR gate 510) the signal having the first logic state when at least one of output signals generated by the plurality of flip-flops has the second logic state, and generating the signal having the second logic state when all the output signals generated by the plurality of flip-flops have the first logic state.

In certain aspects, the plurality of enable signals are received at inputs of a plurality of flip-flops (e.g., DFFs 502, 504, 506), and the enabling of the control mechanism comprises resetting the plurality of flip-flops after the time period. In this case, the resetting of the plurality of flip-flops after the time period is via a delay element (e.g., delay element 580), and the time period is configurable by configuring a delay associated with the delay element.

The various operations of methods described above may be performed by any suitable means capable of performing the corresponding functions. The means may include various hardware component(s) and/or module(s), including, but not limited to one or more circuits. Generally, where there are operations illustrated in figures, those operations may have corresponding counterpart means-plus-function components with similar numbering. In certain aspects, means for receiving may comprise a flip-flop, such as the DFFs 502, 504, 506. In certain aspects, means for generating, means for disabling, means for enabling, and means for providing may comprise a NOR gate such as the NOR gate 510. In certain aspects, means for enabling may comprise a delay element, such as the delay element 580. In certain aspects, means for resetting may comprise a delay element, such as the delay element 580. Means for controlling may comprise AND gates, such as the AND gates 512, 514, 516.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, b-c, and a-b-c, as well as any combination with multiples of the same element (e.g., a-a, a-a-a, a-a-b, a-a-c, a-b-b, a-c-c, b-b, b-b-c, c-c, and c-c-c or any other ordering of a, b, and c).

The various illustrative logical blocks, modules, and circuits described in connection with the present disclosure may be implemented or performed with discrete hardware components designed to perform the functions described herein.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A circuit for switch control, comprising:
   a plurality of flip-flops, each of the plurality of flip-flops having an input coupled to a respective one of a plurality of enable signals;
   a NOR gate having inputs coupled to outputs of the plurality of flip-flops;
   a plurality of AND gates, each having an input coupled to a respective one of the plurality of enable signals and having another input coupled to an output of the NOR gate; and
   a delay element coupled between the output of the NOR gate and reset inputs of the plurality of flip-flops.

2. The circuit of claim 1, wherein the inputs of the plurality of flip-flops comprise clock inputs of the plurality of flip-flops.

3. The circuit of claim 1, wherein other inputs of the plurality of flip-flops are coupled to a voltage rail.

4. The circuit of claim 1, wherein the plurality of flip-flops comprises D flip-flops.

5. The circuit of claim 1, wherein the reset inputs of the plurality of flip-flops are negative logic reset inputs.

6. The circuit of claim 1, wherein a delay associated with the delay element is variable.

7. The circuit of claim 1, wherein the delay element comprises:
 a first inverter;
 a second inverter; and
 a resistor-capacitor (RC) circuit coupled between an output of the first inverter and an input of the second inverter.

8. The circuit of claim 7, wherein the RC circuit comprises:
 a resistive element; and
 a capacitive element coupled to the resistive element, at least one of the resistive element or the capacitive element being tunable.

9. An apparatus having the circuit of claim 1, the apparatus further comprising a plurality of switches, the plurality of switches having control inputs coupled to respective outputs of the plurality of AND gates, wherein the plurality of switches comprise first terminals coupled to respective supply nodes, and wherein second terminals of the plurality of switches are coupled together.

10. A circuit for switch control, comprising:
 switch control circuitry configured to control a plurality of switches; and
 logic configured to:
  receive a plurality of enable signals for controlling the plurality of switches;
  disable a switch control function of the switch control circuitry for a time period from when an enable signal of the plurality of enable signals transitions from a first logic state to a second logic state; and
  enable the switch control function after the time period, wherein the logic comprises a plurality of flip-flops, wherein inputs of the plurality of flip-flops are configured to receive the plurality of enable signals, and wherein the logic is configured to enable the switch control function by resetting the plurality of flip-flops after the time period.

11. The circuit of claim 10, wherein:
 the switch control circuitry comprises a plurality of AND gates;
 the disabling of the switch control function comprises providing a signal having the first logic state to an input of the plurality of AND gates; and
 the enabling of the switch control function comprises providing a signal having the second logic state to the input of the plurality of AND gates.

12. The circuit of claim 11, wherein the logic is further configured to generate the signal having the first logic state and the signal having the second logic state by performing a NOR operation of output signals generated by the plurality of flip-flops.

13. The circuit of claim 11, wherein the logic is further configured to:
 generate the signal having the first logic state when at least one of output signals generated by the plurality of flip-flops has the second logic state; and
 generate the signal having the second logic state when all the output signals generated by the plurality of flip-flops have the first logic state.

14. The circuit of claim 11, wherein the resetting of the plurality of flip-flops after the time period is via a delay element, and wherein the time period is configurable by configuring a delay associated with the delay element.

15. A method for switch control, comprising:
 receiving a plurality of enable signals for controlling a plurality of switches;
 disabling a control mechanism for controlling the plurality of switches for a time period from when an enable signal of the plurality of enable signals transitions from a first logic state to a second logic state; and
 enabling the control mechanism after the time period, wherein the plurality of enable signals are received at inputs of a plurality of flip-flops, and wherein the enabling of the control mechanism comprises resetting the plurality of flip-flops after the time period.

16. The method of claim 15, wherein:
 the control mechanism comprises a plurality of AND gates;
 the disabling of the control mechanism comprises providing a signal having the first logic state to an input of the plurality of AND gates; and
 the enabling of the control mechanism comprises providing a signal having the second logic state to the input of the plurality of AND gates.

17. The method of claim 16, further comprising:
 generating the signal having the first logic state and the signal having the second logic state by performing a NOR operation of output signals generated by the plurality of flip-flops.

18. The method of claim 16, further comprising:
 generating the signal having the first logic state when at least one of output signals generated by the plurality of flip-flops has the second logic state; and
 generating the signal having the second logic state when all the output signals generated by the plurality of flip-flops have the first logic state.

* * * * *